US006773973B2

(12) United States Patent
Kalnitsky et al.

(10) Patent No.: US 6,773,973 B2
(45) Date of Patent: Aug. 10, 2004

(54) SEMICONDUCTOR TRANSISTOR HAVING A POLYSILICON EMITTER AND METHODS OF MAKING THE SAME

(75) Inventors: Alexander Kalnitsky, Portland, OR (US); Sudarsan Uppili, Portland, OR (US); Sang Park, Portland, OR (US)

(73) Assignee: Maxim Integrated Products, Inc., Sunnyvale, CA (US)

(*) Notice: Subject to any disclaimer, the term of this patent is extended or adjusted under 35 U.S.C. 154(b) by 0 days.

(21) Appl. No.: 09/928,914

(22) Filed: Aug. 13, 2001

(65) Prior Publication Data

US 2003/0032232 A1 Feb. 13, 2003

(51) Int. Cl.[7] .......................................... H01L 21/337
(52) U.S. Cl. ..................... 438/189; 438/202; 438/313; 438/322; 257/197; 257/273
(58) Field of Search .................. 438/170, 189, 438/202, 203, 204, 205, 234, 236, 309, 313, 322, 325, 327, 336, 340; 257/47, 197, 205, 273, 351, 361, 362, 370, 373, 378, 423, 427, 479, 477, 498, 511, 517, 525, 526, 539, 542, 552, 555, 556, 557, 565, 575

(56) References Cited

U.S. PATENT DOCUMENTS

| 4,301,588 A | * | 11/1981 | Horng et al. ............... 438/365 |
| 4,483,726 A | * | 11/1984 | Isaac et al. ................. 438/366 |
| 4,746,626 A | * | 5/1988 | Eda et al. ................... 438/315 |
| 5,286,991 A | * | 2/1994 | Hui et al. ................... 257/306 |
| 5,294,558 A | * | 3/1994 | Subbanna ................... 438/359 |
| 5,315,151 A | * | 5/1994 | Hsieh et al. ................. 257/592 |
| 5,323,031 A | * | 6/1994 | Shoji et al. ................. 257/198 |
| 5,371,022 A | * | 12/1994 | Hsieh et al. ................. 438/311 |
| 5,468,989 A | * | 11/1995 | Nishizawa et al. ......... 257/517 |

(List continued on next page.)

OTHER PUBLICATIONS

Ashburn, "Polysilicon Emitter Technology," *Proceedings of the 1989 Bipolar Circuits and Technology Meeting*, Minneapolis Marriott City Center Hotel, Sep. 18–19, 1989, Sponsored by IEEE Electron Devices Society, pp. 90–97.

Burghartz et al., "Perimeter and Plug Effects in Deep Sub–Micron Polysilicon Emitter Bipolar Transistors," *1990 Symposium on VLSI Technology—Digest of Technical Papers*, 1990, pp. 55–56.

Decoutere et al., "A Unified Approach for Hot–Carrier Degradation of Current Gain and 1/f Noise of Polysilicon Emitter Bipolar Transistors," *Proceedings of the 1997 Bipolar/BiCMOS Circuits and Technology Meeting*, Sep. 28–30, 1997, Sponsored by IEEE Electron Devices Society, pp. 104–107.

Reuss et al., "Effects of Interfacial Oxide on Hot Carrier Reliability of Polysilicon Emitter npn Transistors," *Proceedings of the 1993 Bipolar/BiCMOS Circuits and Technology Meeting*, 1993, Sponsored by IEEE Electron Devices Society, pp. 219–222.

*Primary Examiner*—George Fourson
*Assistant Examiner*—Fernando L. Toledo
(74) *Attorney, Agent, or Firm*—Blakely, Sokoloff, Taylor & Zafman LLP

(57) ABSTRACT

A polysilicon-emitter-type transistor has a substrate with a collector region, a base region on the collector region, and an oxide layer on the base region with an emitter window therein exposing part of the base region. The polysilicon emitter is formed by forming a first polysilicon layer of approximately 30 to 100 Angstroms at least within the emitter window and at least on the exposed base region. Then, an interfacial oxide layer being approximately 5 to 50 Angstroms thick is formed in an upper portion of the first polysilicon layer, for example, by exposing the first polysilicon layer to oxygen and annealing. Then, a second polysilicon layer is formed on the interfacial oxide layer. The thickness of the second polysilicon layer may be approximately 500 to 5000 Angstroms thick. Subsequent annealing diffuses dopants in the emitter more uniformly into the base region.

36 Claims, 2 Drawing Sheets

U.S. PATENT DOCUMENTS 5,488,003 A * 1/1996 Chambers et al. .......... 438/309
5,656,514 A * 8/1997 Ahlgren et al. ............. 438/320
6,362,066 B1 * 3/2002 Ryum et al. ................. 438/364
6,570,242 B1 * 5/2003 Johnson ...................... 257/593

* cited by examiner

SEMICONDUCTOR TRANSISTOR HAVING A POLYSILICON EMITTER AND METHODS OF MAKING THE SAME

TECHNICAL FIELD

This invention relates to a semiconductor transistor having a polysilicon emitter and methods of making the same.

BACKGROUND

Transistors with polysilicon emitters generally have high current gains compared to transistors with metal emitters. FIG. 1 shows a conventional polysilicon emitter transistor 50. The polysilicon emitter 50 includes a collector region 52, a single crystal silicon base region 54, and an oxide layer 56. An emitter window 60 is created through the oxide layer 56 and is filled with an undoped polysilicon layer 58. Subsequently, the undoped polysilicon layer 58 is doped using ion implantation and annealed at a high temperature to diffuse the dopants onto the underlying single crystal silicon base region 54. Polysilicon emitter transistors may also be formed using an in-situ doped polysilicon layer.

However, as a result of the deposition of the polysilicon layer 58, the grain size of the polysilicon layer 58 may increase to the extent of forming a single crystal epitaxy. The grain size is illustrated in FIG. 1 where reference number 62 indicates a boundary between grains. Often, the grain size of the polysilicon layer 58 is comparable to the size of the emitter window 60. The grain size may limit the size of the emitter window 60 and thus may limit the size of the transistor device 50. In addition, the resulting grain size may have the undesirable effect of preventing uniform diffusion of dopants from the polysilicon layer 58 to the base region 54. The non-uniform diffusion of dopants may have a negative impact on the current gain of the polysilicon emitter transistor 50. Moreover, the use of in-situ doped polysilicon may have an even greater negative effect on the current gain of the transistor 50 than the use of undoped polysilicon that is subsequently doped.

SUMMARY

The invention provides polysilicon-emitter transistor devices that overcome limitations of prior art devices. According to one aspect of the invention, a polysilicon emitter transistor includes a transistor having an emitter window exposing a base region of the transistor. A first polysilicon layer is deposited within the emitter window at least on the base region. An interfacial oxide layer is then formed, for example, by annealing the first polysilicon layer. Then, a second polysilicon layer is formed on the interfacial oxide layer.

In different embodiments, the emitter window may be approximately 0.1 to 0.2 μm wide, and the first polysilicon layer may be approximately 30 to 100 Angstroms (Å) thick prior to formation of the interfacial oxide. The interfacial oxide may be approximately 5 to 50 Å thick and can be thermally grown. The second polysilicon layer may be approximately 500 to 5000 Å thick and dopants can be ion-implanted in the second polysilicon layer. An annealing process may also be applied after deposition of the second polysilicon layer.

Advantages of the invention include one or more of the following. The polysilicon grain size in the region of the emitter adjacent to the base region is smaller, and because of this, smaller polysilicon-emiter transistors may be realized and the diffusion of dopants from the emitter to base is more uniform. The uniform diffusion of dopants also can increase the current gain and the speed of the transistor. The interfacial oxide layer may also improve the flow of majority carriers through the emitter diffusion region and into the intrinsic base sub-region without having to heavily dope the intrinsic base sub-region. Also, transistors may be made with a thinner emitter diffusion region and a narrower intrinsic base sub-region. As a result, the current gain and speed performance of the transistor may be improved without negatively impacting the resistance of the intrinsic base sub-region or the resistance of the emitter diffusion region.

The techniques disclosed are applicable to any polysilicon-emitter transistor device regardless of the type of dielectric or oxide layer deposited on the base region. The invention also applies to bipolar transistors used in bipolar-complementary metallic oxide semiconductors (Bi-CMOS) semiconductor devices.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
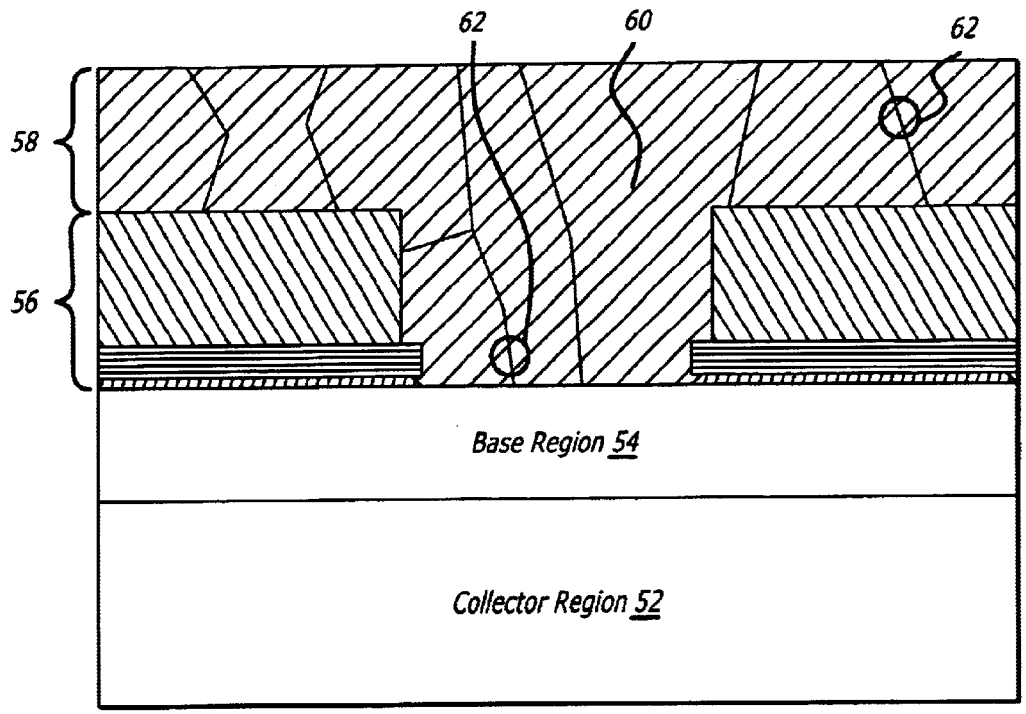
FIG. 1 is a cross-sectional view of a prior art transistor.
Figure 2:
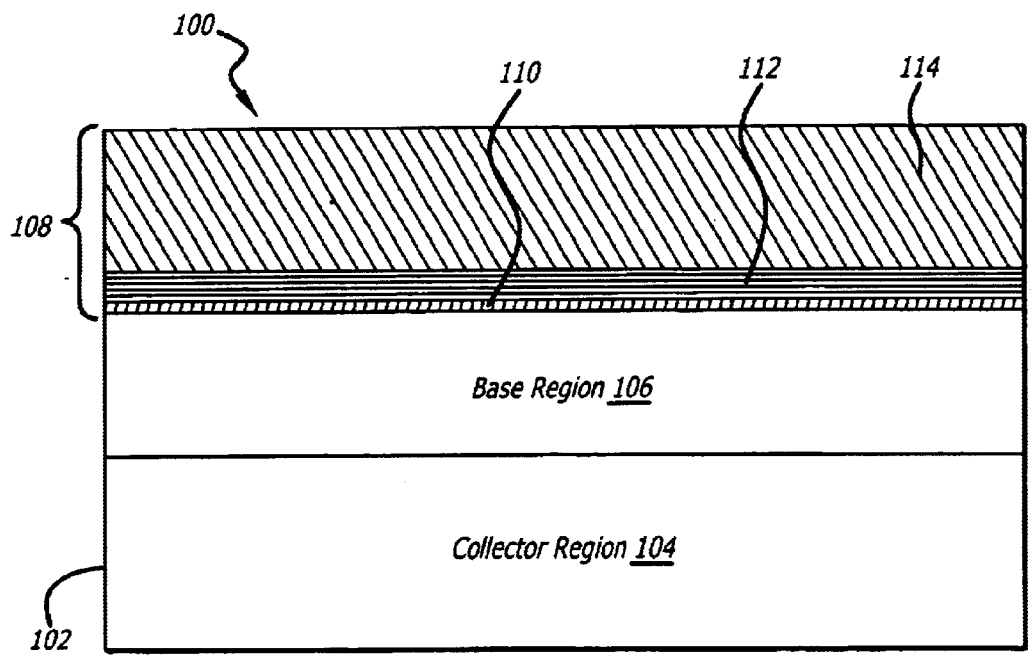
FIGS. 2–4 are cross-sectional views depicting steps of manufacturing a transistor having a polysilicon emitter in accordance with the invention.

FIG. 2 illustrates a cross-sectional view of an exemplary semiconductor device 100 at an intermediate step of forming a bipolar device having a polysilicon emitter in accordance with the invention. At this intermediate step, the semiconductor device 100 comprises a substrate 102 having a collector region 104, a base region 106 formed over the collector region 104, and an oxide region 108 formed over the base region.

In the exemplary embodiment, the collector region 104 is formed by masking the top surface of the substrate 102 to define the collector region, heavily doping the substrate 102 with n-doping material (e.g. phosphorous or arsenic) to form a diffused n-doped region, and then forming a lighter n-doped epitaxial layer above the heavily doped diffused region. The base region 106 may be formed of silicon, silicon-germanium, or silicon-germanium-carbon, and may be epitaxially grown and doped with p-doping material (e.g. boron).

In the exemplary embodiment, the oxide layer 108 can be a dielectric layer such as a single oxide layer, an oxide-nitride-oxide (ONO) stack, or other dielectric layer. For example, the oxide layer 108 can be implemented as an ONO stack comprising a lower silicon dioxide ($SiO_2$) layer 110 formed over the base region 106, a silicon nitride ($Si_3N_4$) layer 112 formed over the silicon dioxide ($SiO_2$) layer 110, and an upper silicon dioxide ($SiO_2$) layer 114 formed over the silicon nitride ($Si_3N_4$) layer 112.

The lower silicon dioxide ($SiO_2$) 110 may be grown or deposited, and is thereafter annealed. The thickness for the lower silicon dioxide ($SiO_2$) layer 110 may be approximately 30 to 200 Å. The silicon nitride ($Si_3N_4$) layer 112 may be deposited by low pressure chemical vapor deposition (LPCVD), atmospheric pressure chemical vapor deposition (APCVD), or plasma enhanced chemical vapor deposition (PECVD). The thickness of the silicon nitride ($Si_3N_4$) layer 112 may be approximately 50 to 1000 Å. The upper silicon dioxide ($SiO_2$) layer 114 is deposited by chemical vapor deposition (CVD) or plasma-enhanced chemical vapor deposition (PECVD), and may have a thickness of approximately 1000 to 5000 Å.

Figure 3:
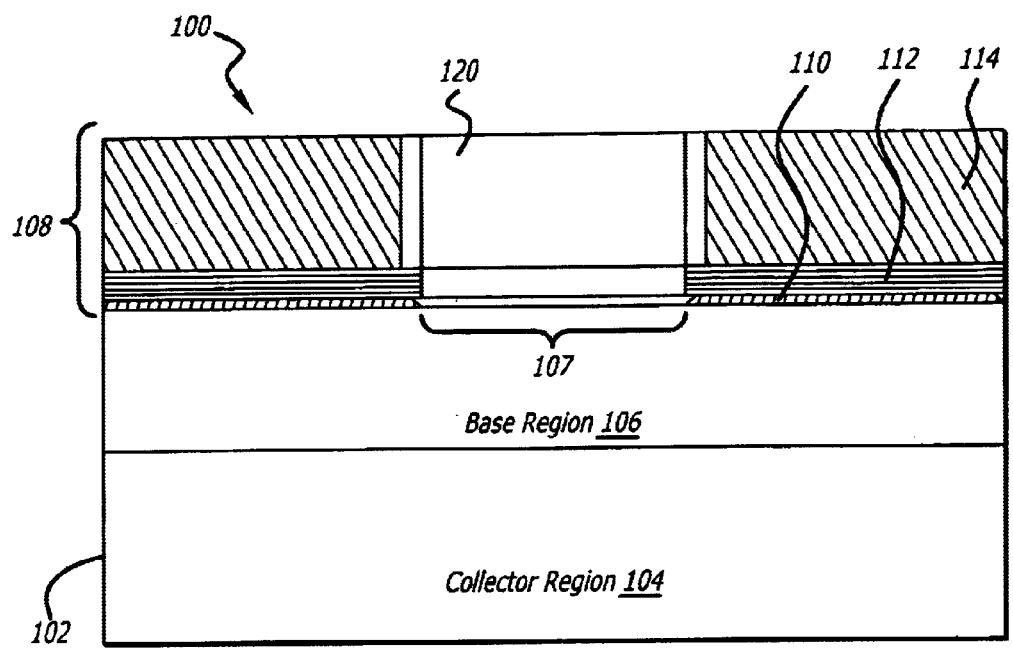

FIG. 3 illustrates a cross-sectional view of the exemplary semiconductor device 100 at a subsequent step of forming a bipolar device in accordance with the invention. In this subsequent step, standard photolithographic techniques are used to etch through the oxide layer 108 and create an emitter window 120. The emitter window 120 defines the intrinsic emitter, base and collector regions of the device and may be approximately 0.1 to 0.2 μm wide as indicated by reference number 107.

Figure 4:
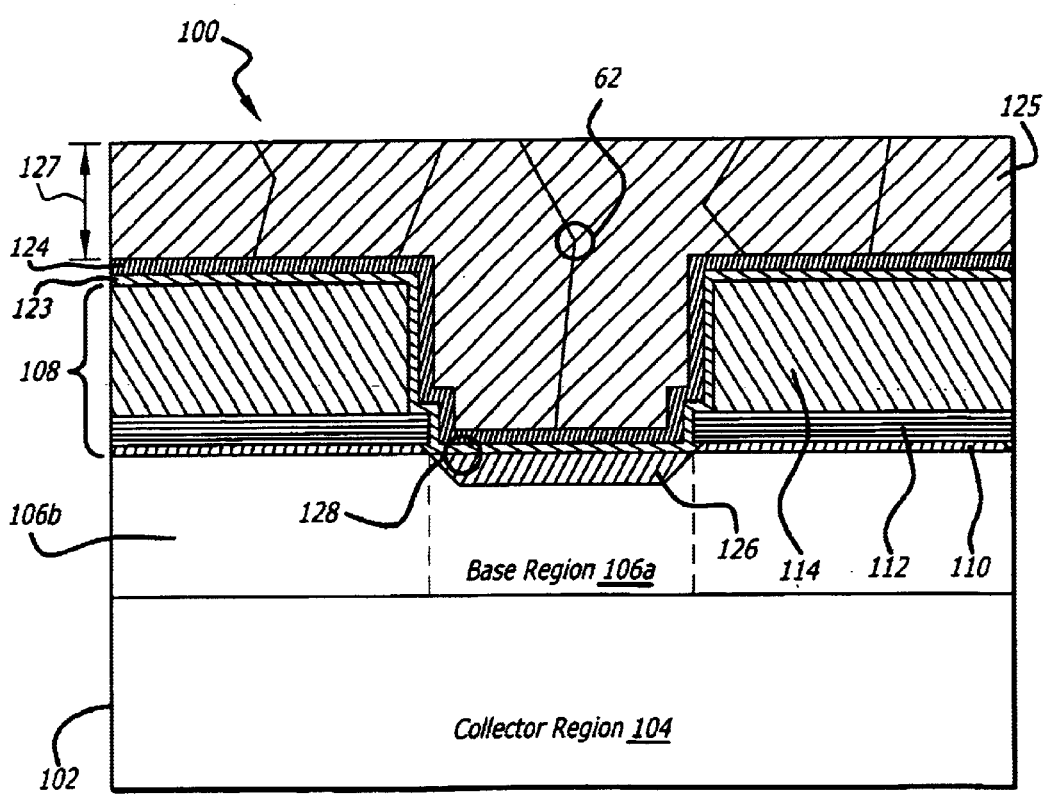

FIG. 4 illustrates a cross-sectional view of the exemplary semiconductor device 100 at a subsequent step of forming a bipolar device in accordance with the invention. In this step, a first polysilicon layer is used to fill the emitter window 120 and at least on the base region. At this stage, this first polysilicon layer would consist of layers 123 and 124 of FIG. 4. However, as will be understood following later discussion, the first polysilicon layer is treated so that layer 123 remains as a polysilicon layer, but layer 124 is an interfacial oxide layer. The initially formed first polysilicon layer (which we will refer to as layers 123 and 124) may be un-doped and deposited using, for example, LPCVD, rapid thermal chemical vapor deposition (RTCVD), or other similar techniques. The first polysilicon layer 123 and 124 may have a thickness of approximately 30 to 100 Å. In another embodiment, the first polysilicon layer 123 and 124 may comprise an amorphous silicon layer.

Once the thickness of the first polysilicon layer 123 and 124 reaches a predetermined thickness value of approximately 30 to 100 Å, the deposition process is interrupted and oxygen is bled into a process chamber that is used during the deposition process. The details of bleeding oxygen into the process chamber are dependent on the design of the LPCVD or RTCVD reactor.

The bleeding of oxygen into the process chamber facilitates the oxidation of a portion of the first polysilicon layer 123 and 124 so as to form an interfacial oxide layer 124, and leaving the remaining layer 123 as polysilicon. The interfacial oxide layer 124 is thermally grown during a first anneal step to a thickness of approximately 5 to 50 Å. The temperature of the first anneal step should be higher than the temperature used during the deposition of the first polysilicon layer 123 and 124. The first anneal step facilitates the crystallization of the polysilicon so that a small grain size is formed in a lower region 128 that is adjacent to the intrinsic base region 106a. If the initially deposited first polysilicon layer 123 and 124 is an amorphous silicon layer, then the first anneal step may convert the silicon into polysilicon and crystallize the lower region 128 of the silicon.

The first anneal process time can range from a few seconds to 150 minutes depending on the type of equipment used to perform the annealing. For example, in a furnace type reactor having a relatively large volume, the anneal temperature may be lower and the anneal time may be longer than another type of reactor. The temperature applied during the anneal process can range from 400° to 900° C. and is also dependent on the type of reactor (e.g. epitaxial silicon deposition chamber, such as ASM Epsilon or Applied Materials Centura, or a RTCVD reactor).

Once the interfacial oxide layer 124 is formed, a second polysilicon layer 125 is deposited over the interfacial oxide layer 124. The thickness of the second polysilicon layer 125 is measured at a flat surface indicated by reference number 127 and is approximately 500 to 5000 Å. The second polysilicon layer 125 is deposited using the same techniques as are employed to deposit the first polysilicon layer 123. The second polysilicon layer 125 is either deposited in-situ doped or non-doped and then doped to achieve a certain conductivity. The doping material or dopants can include n-doping material such as phosphorus or arsenic if the device is a NPN type transistor. On the other hand, if the device is a PNP type transistor, then the doping material can include p-doping material such as boron.

A second annealing step can be applied to the second polysilicon layer 125 so as to drive the dopants from the second polysilicon layer 125, through the first polysilicon layer 123, and into the base region 106. In another embodiment, the second polysilicon layer 125 can comprise an amorphous silicon layer.

After doping the second polysilicon layer 125, the dopants diffuse thru the interfacial layer 124 and the first polysilicon layer 123 and into a portion of the base region 106, thus forming an emitter diffusion region 126. The emitter diffusion region 126 thereby reduces the thickness of the base region 106 below the emitter diffusion region 126. The sub-region of the base region 106 below the emitter diffusion region 126 is termed herein as the intrinsic base sub-region 106a. The sub-region of the base region 106 not below the emitter diffusion region 126 is termed herein as the extrinsic base sub-region 106b.

The small grain size of the polysilicon at the lower region 128 facilitates the uniform diffusion of dopants into the intrinsic base region 106a. Reference number 62 refers to an upper region whose grain size is large in comparison to the lower region 128. The uniform diffusion of dopants can increase the current gain and the speed of the device 100.

A number of embodiments of the invention have been described. Nevertheless, it will be understood that various modifications may be made without departing from the spirit and scope of the invention. For example, oxide layers other than oxide-nitride-oxide layers can be used in the invention. Accordingly, other embodiments are within the scope of the following claims.

What is claimed is:

1. A method of fabricating a polysilicon emitter in a semiconductor transistor having an emitter window exposing a base region, the method comprising:

forming a first polysilicon layer within the emitter window;

forming an interfacial oxide layer in an upper portion of the first polysilicon layer; and forming a second polysilicon layer on the interfacial oxide layer;

the first polysilicon layer, the interfacial oxide layer and the second polysilicon layer forming a three layer structure extending at least over the entire emitter window.

2. The method of claim 1, wherein the emitter window is approximately 0.1 to 0.2 μm wide.

3. The method of claim 1, wherein the first polysilicon layer is formed to
a thickness of approximately 30 to 100 Å.

4. The method of claim 3, wherein the interfacial oxide layer is formed by exposing oxygen to the first polysilicon layer and annealing.

5. The method of claim 3, wherein the interfacial oxide is formed to a thickness of approximately 5 to 50 Å.

6. The method of claim 5, wherein the second polysilicon layer is formed to a thickness of approximately 500 to 5000 Å excluding the depth of the emitter window.

7. The method of claim 1, wherein forming the second polysilicon layer comprises ion-implanting dopants into the second polysilicon layer.

8. The method of claim 1, further comprising annealing after forming the second polysilicon layer to diffuse dopants from the polysilicon emitter and into the base region.

9. A polysilicon emitter in a semiconductor transistor having an emitter window area exposing a base region, comprising:
   a first polysilicon layer covering at least the emitter window area;
   an interfacial oxide layer covering the first polysilicon layer within the emitter window area; and
   a second polysilicon layer covering the interfacial oxide layer within the emitter window area;
   the foregoing structure being annealed ta form the polysilicon emitter.

10. The structure of claim 9, wherein the emitter window is approximately 0.1 to 0.2 µm wide.

11. The structure of claim 9, wherein the first polysilicon layer is less than approximately 100 Å thick.

12. The structure of claim 11, wherein the interfacial oxide is less than approximately 50 Å thick.

13. The structure of claim 12, wherein the second polysilicon layer is approximately 500 to 5000 Å thick excluding the depth of the emitter window.

14. A method of fabricating a bipolar transistor, comprising:
   forming a collector region within a substrate;
   forming a base region on the collector region;
   fanning an emitter dielectric layer on the base region;
   forming an opening through the emitter dielectric layer to form an emitter window exposing a portion of the base region;
   forming a first polysilicon layer within the emitter window;
   forming an interfacial oxide layer in an upper portion of the first polysilicon layer; and
   forming a second polysilicon layer on the interfacial oxide layer;
   the first polysilicon layer, the interfacial oxide layer and the second polysilicon layer forming a three layer structure extending over the entire emitter window.

15. The method of claim 14, wherein the emitter window is approximately 0.1 to 0.2 µm wide.

16. The method of claim 14, wherein the first polysilicon layer is formed to a thickness of approximately 30 to 100 Å.

17. The method of claim 16, wherein the interfacial oxide layer is formed by exposing oxygen to the first polysilicon layer and annealing.

18. The method of claim 16, wherein the interfacial oxide is formed to a thickness of approximately 5 to 50 Å.

19. The method of claim 17, wherein the second polysilicon layer is formed to a thickness of approximately 500 to 5000 Å excluding the depth of the emitter window.

20. The method of claim 14, wherein forming the second polysilicon layer comprises ion-implanting dopants into the second polysilicon layer.

21. The method of claim 14, further comprising annealing after forming the second polysilicon layer.

22. A bipolar transistor, comprising:
   a substrate having a collector region;
   a base region on the collector region;
   an oxide layer on the base region, the oxide layer having an opening therethrough to form an emitter window exposing a portion of the base region;
   a first polysilicon layer at least within the emitter window;
   an interfacial oxide layer on the first polysilicon layer; and
   a second polysilicon layer on the interfacial oxide layer;
   the first polysilicon layer, the interfacial oxide layer and the second polysilicon layer forming a three layer structure extending over the entire emitter window prior to annealing the transistor.

23. The bipolar transistor of claim 22, wherein the emitter window is approximately 0.1 to 0.2 µm wide.

24. The bipolar transistor of claim 22, wherein the first polysilicon layer is less than approximately 100 Å thick.

25. The bipolar transistor of claim 24, wherein the interfacial oxide is less than approximately 50 Å thick.

26. The bipolar transistor of claim 25, wherein the second polysilicon layer is approximately 500 to 5000 Å thick excluding the depth of the emitter window.

27. The method of claim 1, wherein the first polysilicon layer is in direct contact with an intrinsic base region.

28. The polysilicon emitter of claim 9, wherein the first polysilicon layer is in direct contact with an intrinsic base region.

29. The method of claim 14, wherein the first polysilicon layer is in direct contact with an intrinsic base region.

30. The transistor of claim 22, wherein the first polysilicon layer is in direct contact with an intrinsic base region.

31. A method of fabricating a polysilicon emitter in a semiconductor transistor having an emitter window exposing an intrinsic base region, the method comprising:
   forming a first polysilicon layer within the emitter window on at least the intrinsic base region;
   forming an interfacial oxide layer in an upper portion of the first polysilicon layer; and
   forming a second polysilicon layer on the interfacial oxide layer, wherein the first polysilicon layer is in direct contact with the intrinsic base region and the second polysilicon layer is not in direct contact with the base region.

32. A polysilicon emitter in a semiconductor transistor having an emitter window exposing an intrinsic base region, comprising:
   a first polysilicon layer within the emitter window on at least the exposed intrinsic base region and in direct contact with the intrinsic base region,
   an interfacial oxide layer on the first polysilicon layer; and
   a second polysilicon layer on the interfacial oxide layer, wherein the second polysilicon layer is not in direct contact with the intrinsic base region.

33. A method of fabricating a bipolar transistor, comprising:
   forming a collector region within a substrate;
   forming an intrinsic base region on the collector region;
   forming an emitter dielectric layer on the extrinsic base region;
   forming an opening through the emitter dielectric layer to form an emitter window exposing a portion of the intrinsic base region;

forming a first polysilicon layer within the emitter window on at least the exposed intrinsic base region and in direct contact with the intrinsic base region;

forming an interfacial oxide layer in an upper portion of the first polysilicon layer; and forming a second polysilicon layer on the interfacial oxide layer, wherein the second polysilicon layer is not in direct contact with, the intrinsic base region.

34. A bipolar transistor, comprising:

a substrate having a collector region;

an intrinsic base region on the collector region;

an oxide layer on the intrinsic base region, the oxide layer having an opening therethrough to form an emitter window exposing a portion of the intrinsic base region;

a first polysilicon layer at least within the emitter window on at least the exposed intrinsic base region and in direct contact with the intrinsic base region;

an interfacial oxide layer on the first polysilicon layer; and a second polysilicon layer on the interfacial oxide layer, wherein the second polysilicon layer is not in direct contact with the base region.

35. The method of claim 1, wherein forming the second polysilicon layer comprises in-situ doping during polysilicon deposition.

36. The method of claim 14, wherein forming the second polysilicon layer comprises in-situ doping during polysilicon deposition.

* * * * *